(12) United States Patent
Chang et al.

(10) Patent No.: US 9,177,814 B2
(45) Date of Patent: Nov. 3, 2015

(54) SUSPENDED SUPERCONDUCTING QUBITS

(71) Applicant: International Business Machines Corporation, Armonk, NY (US)

(72) Inventors: Josephine B. Chang, Bedford Hills, NY (US); George A. Keefe, Cortlandt Manor, NY (US); Chad T. Rigetti, Brooklyn, NY (US); Mary E. Rothwell, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/834,291

(22) Filed: Mar. 15, 2013

(65) Prior Publication Data

US 2014/0264286 A1    Sep. 18, 2014

(51) Int. Cl.
*H01L 39/22* (2006.01)
*H01L 49/00* (2006.01)
*H01L 21/304* (2006.01)
*G06N 99/00* (2010.01)
*H01L 27/18* (2006.01)

(52) U.S. Cl.
CPC ............ *H01L 21/304* (2013.01); *G06N 99/002* (2013.01); *H01L 27/18* (2013.01)

(58) Field of Classification Search
USPC ............ 257/31, E39.014, E49.003; 365/162; 505/832
IPC ................................ H01L 39/223, 27/18, 49/006
See application file for complete search history.

(56) References Cited

U.S. PATENT DOCUMENTS

| 5,212,147 | A | 5/1993 | Sheats |
| 5,768,297 | A | 6/1998 | Shor |
| 6,605,225 | B1 * | 8/2003 | Yamashita et al. ................ 216/3 |
| 6,900,456 | B2 | 5/2005 | Blais et al. |
| 7,411,187 | B2 | 8/2008 | Monroe et al. |
| 7,547,932 | B2 | 6/2009 | Zhang et al. |
| 8,437,818 | B1 | 5/2013 | Tolpygo et al. |
| 2004/0029050 | A1 * | 2/2004 | Brenner et al. ................ 430/312 |
| 2006/0065622 | A1 | 3/2006 | Floyd et al. |
| 2009/0321719 | A1 * | 12/2009 | Folman et al. .................. 257/25 |
| 2011/0089405 | A1 * | 4/2011 | Ladizinsky et al. ............. 257/31 |

FOREIGN PATENT DOCUMENTS

EP    1884791 A1    2/2008

OTHER PUBLICATIONS

Yu-Lin et al.; "Fabrication of Al/AlOx/Al Josephson junctions and superconducting quantum circuits by shadow evaporation and a dynamis oxidation process"; Jun. 2013; Chinese Physics B; vol. 22, No. 6; pp. 060309-1-060309-5.*

Lecocq et al.; "Novel e-beam lithography technique for in-situ junction fabrication: the controlled undercut"; arXiv pre-print arXiv:1101.4576v2; Feb. 2011; pp. 1-5.*

R. Barends et al., "Minimal resonator loss for circuit quantum electrodynamics," Applied Physics Letters, vol. 97, Issue 2, Jul. 2010, 023508, 3 pages.

(Continued)

*Primary Examiner* — Marcos D Pizarro
(74) *Attorney, Agent, or Firm* — Cantor Colburn LLP; Vazken Alexanian

(57) ABSTRACT

A qubit system includes a substrate layer, a qubit circuit suspended above the substrate layer and fine structure disposed between the qubit circuit and the substrate layer.

5 Claims, 4 Drawing Sheets

(56) References Cited

OTHER PUBLICATIONS

K. Cicak et al., "Low-loss superconducting resonant circuits using vacuum-gap-based microwave components," Applied Physics Letters, vol. 96, Issue 9, Mar. 2010, 093502, 3 pages.
M. D. LaHaye et al., "Nanomechanical measurements of a superconducting qubit," Nature, vol. 459, Jun. 18, 2009, pp. 960-964.
M. R. Vissers et al., "Reduced microwave loss in trenched superconducting coplanar waveguides," Applied Physics Letters, vol. 100, Issue 8, Feb. 2012, 082602, 3 pages.
J. Wenner et al., "Surface loss simulations of superconducting coplanar waveguide resonators," Applied Physics Letters, vol. 99, Issue 11, Sep. 2011, 113513, 3 pages.
C. Rigetti et al., "Superconducting qubit in a waveguide cavity with a coherence time approaching 0.1 ms.," Physical Review B, vol. 86, No. 10, 2012, 100506, pp. 1-5.

J. M. Martinis, "Superconducting phase qubits." Quantum Information Processing, vol. 8, No. 2-3, 2009, pp. 81-103.
R. Bialczak, "Development of The Fundamental Components of a Superconducting Qubit Quantum Computer," PhD Dissertation, University of California, Santa Barbara, 2011, pp. 1-221.
S. Yao et al., "SiN-based micro cantilever actuators using NdFeB/Ta permanent magnetic thin film." 4th IEEE International Conference on Nano/Micro Engineered and Molecular Systems, 2009. NEMS 2009, pp. 416-419.
X. L. Fu et al., "Gas-assisted etching of niobium with focused ion beam," Microelectronic Engineering, Proceedings of the 30th International Conference on Micro- and Nano-Engineering, vol. 78-79, Mar. 2005, pp. 29-33.

* cited by examiner

SUSPENDED SUPERCONDUCTING QUBITS

BACKGROUND

The present invention relates to quantum computing, and more specifically, to suspended superconducting qubits and methods of manufacturing the same.

Superconducting quantum circuits containing Josephson junctions are currently being pursued as the information-storing building blocks (i.e., quantum bits, or qubits) of a quantum computer. A basic challenge towards this goal is developing devices whose quantum coherence lasts long enough to enable control and measurement with error rates below the bounds requisite for quantum error correction. Lossy materials within the mode volume of superconducting resonant structures impose a limit on how long such systems can store energy. Reducing the participation ratio of energy-storing non-vacuum materials (inclusive of surfaces, interfaces, thin films, and bulk matter) within the mode volume increases this limit. In particular, two-level systems present at surfaces and interfaces of superconducting qubits are believed to be a significant source of decoherence. The substrate-to-metal interface and substrate-to-air interface are believed to be a source of loss. Typical superconducting qubits are manufactured with aluminum thin films deposited on an insulating substrate of silicon or sapphire.

SUMMARY

Exemplary embodiments include a qubit system, including a substrate layer, a qubit circuit suspended above the substrate layer and fine structure disposed between the qubit circuit and the substrate layer.

Additional exemplary embodiments include a method of fabricating a qubit system, the method including forming a qubit circuit on a substrate and undercutting the substrate such that a fine structure remains suspending the qubit circuit above remaining substrate.

Further exemplary embodiments include a method of fabricating a qubit system, the method including forming a plurality of metallic anchors within a substrate, forming a qubit circuit on the substrate and removing a portion of the substrate.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In exemplary embodiments, the systems and methods described herein include superconducting quantum circuits for quantum information processing in which circuit components (linear and non-linear) are formed by a thin-film superconductor suspended above the surface of a substrate. This orientation removes the substrate-to-metal interface and moves the substrate-to-air interface further away from the electric fields of the resonant modes of the quantum circuit. Several methods of making the exemplary suspended qubits are now described herein. In exemplary embodiments, the qubit circuit is suspended above and coupled to the substrate. As further described herein, the fine structure can be remaining substrate material after undercut processing is implemented. The fine structure can also be anchors fabricated between the qubit circuit and the substrate.

Figure 1A:
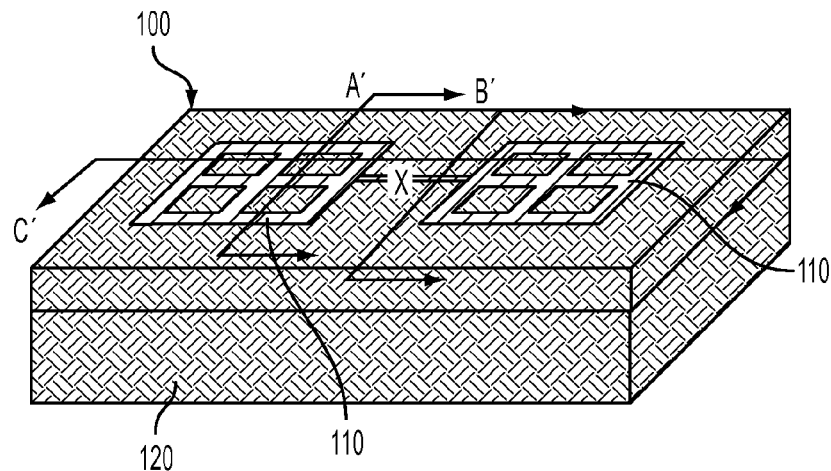
FIG. 1A illustrates a perspective view of an exemplary suspended qubit circuit device.
Figure 1B:
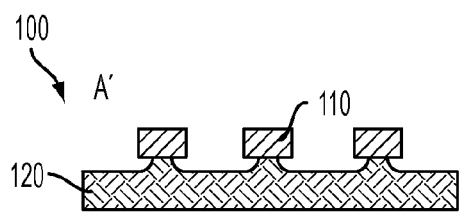
FIG. 1B illustrates a cross sectional view of the exemplary suspended qubit circuit device of FIG. 1A, taken along the line A.
Figure 1C:
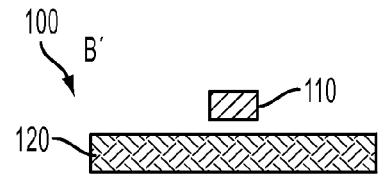
FIG. 1C illustrates a cross sectional view of the exemplary suspended qubit circuit device of FIG. 1A, taken along the line B.
Figure 1D:
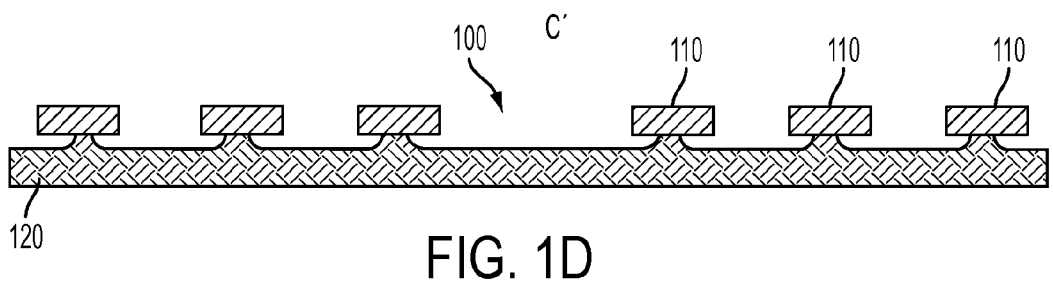
FIG. 1D illustrates a cross sectional view of the exemplary suspended qubit circuit device of FIG. 1A, taken along the line C.
Figure 2:
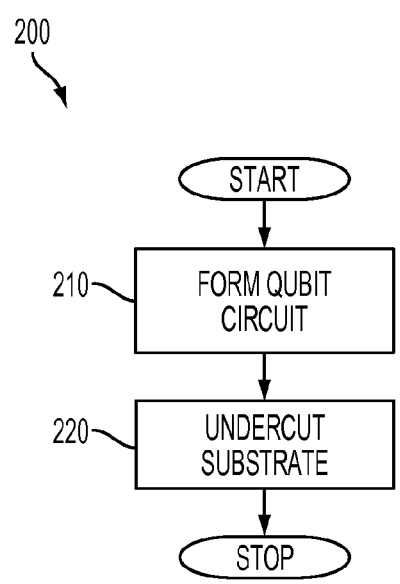
FIG. 2 illustrates a flow chart of a method of fabricating a suspended qubit circuit device in accordance with exemplary embodiments.

FIG. 1A illustrates an exemplary suspended qubit circuit device 100. FIGS. 1B-1D illustrate cross sectional views of the exemplary suspended qubit circuit device 100 of FIG. 1A. FIG. 2 illustrates a flow chart of a method 200 of fabricating a suspended qubit circuit device in accordance with exemplary embodiments. At block 210, a qubit circuit 110 is fabricated on a substrate 120.

Fabrication of the qubit circuit may proceed by any of a number of processes that are well-known in the art. Two examples are (1) subtractive patterning of a trilayer (superconductor(s)-insulator-superconductor(s)) material stack or (2) the Dolan bridge process. Although several other qubit fabrication procedures are contemplated, the Dolan Bridge technique is described herein as an illustrative example. The main fabrication technique is now described, using a Josephson junction (a superconductor-insulator-superconductor sandwich) as an example. In exemplary embodiments, the substrate 120 can be low resistivity (Boron doped) two-inch silicon wafers. A bilayer of resist is spun on the wafers, which consists of a copolymer methyl methacrylate (MMA) layer and a subsequent thinner layer of polymethyl methacrylate (PMMA). Using electron-beam lithography, a pattern for the qubit circuit 110 is written into the resist. This step is followed by development in an MIBK:IPA (Methyl Isobutyl Ketone (MIBK) Isopropyl alcohol (IPA)) (1:3) solution for about one minute, which eats away all the areas exposed to the electron beam. The MMA layer is more sensitive to the electron beam, which creates areas of undercut PMMA. As such, a suspended bridge out of the PMMA can be made with no MMA beneath. The sample is placed in an e-beam evaporator where Al is evaporated at two angles with oxidation (in an $Ar/O_2$ atmosphere) between Al evaporations. The junction is formed in the overlap area. The remaining resist and unwanted metal is removed by placing the sample in acetone. Using this lift-off technique, junction areas can be made ranging from 20 mm$^2$ to 50 nm$^2$. This basic fabrication process can be used with other extra fabrication steps such as PECVD, optical lithography, and RIE to make more complicated devices. Finally, the wafer is diced into small (~1×1 cm$^2$) chips. In exemplary embodiments, as part of the qubit circuit 110, a Josephson Bifurcation Amplifier (JBA) can be fabricated. A JBA is a current amplifier based on the non-linear inductance of the Josephson junction. It was designed as a sensitive readout device for a qubit in the qubit circuit 110. A capacitor is fabricated in parallel with the junction to form a non-linear LC oscillator with two stable oscillating states. The capacitor is formed by depositing a copper ground plane followed by a silicon nitride insulating layer (in PECVD). Resist is then spun over the chip. The junction with top capacitor electrodes is subsequently deposited using the procedure described above. Chromium (Cr) layers sandwiching a copper (Cu) layer are used to protect the Cu during silicon nitride deposition while a titanium (Ti) layer is utilized to promote adhesion of a silicon nitride layer. FIG. 1A illustrates the qubit circuit 110 formed on the substrate 120.

In exemplary embodiments, the qubit circuit 110 (which will be an exemplary suspended qubit) is fabricated on a silicon (Si) substrate using materials that are stable in xenon difluoride (XeF$_2$) etching procedures, including aluminum (Al), aluminum oxide (Al$_x$O$_y$), and titanium nitride (TiN). In exemplary embodiments, the substrate 120 is selected to reduce dielectric loss tangent at low temperatures. The substrate 120 is also selected to be a material which can be etched selectively to the superconducting and dielectric material to be used for the qubit circuit 110. For example, high resistivity Si wafers may be implemented.

Referring still to FIG. 2, at block 220, the substrate 120 is undercut beneath the qubit circuit 110. As described herein, undercut of substrate 120 can be implemented using substrate etching selective to qubit materials (e.g., deposited using Dolan bridge process). For example, for an Al/Al$_2$O$_3$/Al qubit on the Si substrate, a XeF$_2$ etch may be used.

In exemplary embodiments, the substrate 120 is undercut only along the perimeter of the qubit features as illustrated in FIG. 1B. In other exemplary embodiments, the Si substrate 120 is completely undercut from beneath finer features as shown in FIG. 1C, using a timed XeF$_2$ etch, and the qubit circuit 110 is anchored by larger features which are not completely undercut as shown in FIG. 1D. In other exemplary embodiments, the qubit circuit 110 is fabricated on a Si-on-sapphire (SOS) substrate and the Si portion of the substrate 120 is removed using a timed etch.

In other exemplary embodiments, holes are patterned in the Si portion of the SOS substrate, and anchors are formed in these holes which support the suspended structures when the Si is completely removed, as now described.

Figure 3A:
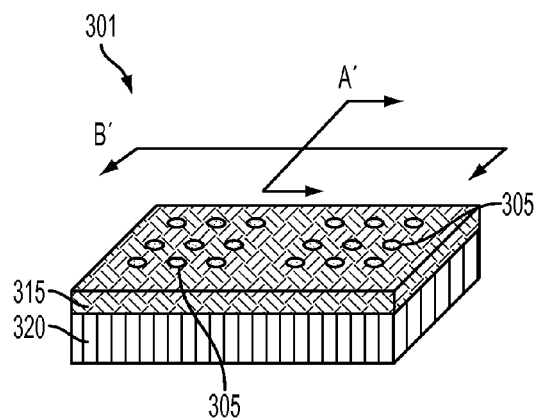
FIG. 3A illustrates a perspective view of an intermediate structure of exemplary suspended qubit circuit device.
Figure 3C:
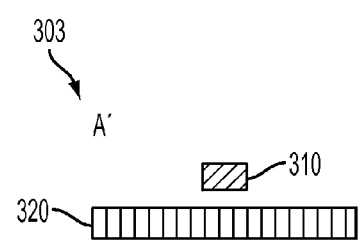
FIG. 3C illustrates a cross sectional view of an exemplary suspended qubit circuit device, taken along the line A'.
Figure 3B:
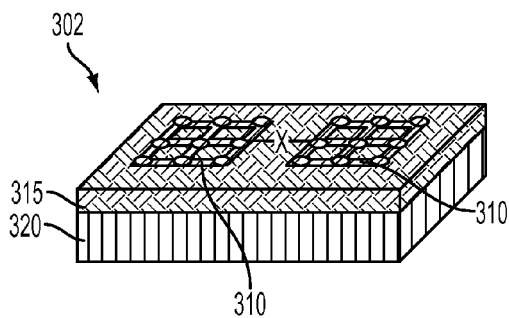
FIG. 3B illustrates a perspective view of an intermediate structure of exemplary suspended qubit circuit device.
Figure 3D:
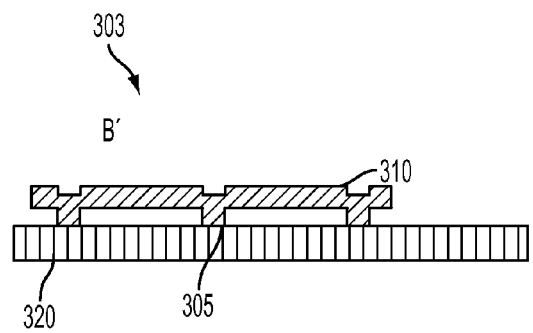
FIG. 3D illustrates a cross sectional view of an exemplary suspended qubit circuit device, taken along the line B'.

FIG. 3A illustrates an intermediate structure 301 of exemplary suspended qubit circuit device showing anchors 305 disposed in a sacrificial substrate layer 315, which is disposed atop a substrate 320. FIG. 3B illustrates an intermediate structure 302 of the exemplary suspended qubit circuit device with a qubit circuit 310. FIGS. 3C-3D illustrate cross sectional views of the exemplary suspended qubit circuit device 303.

Figure 4:
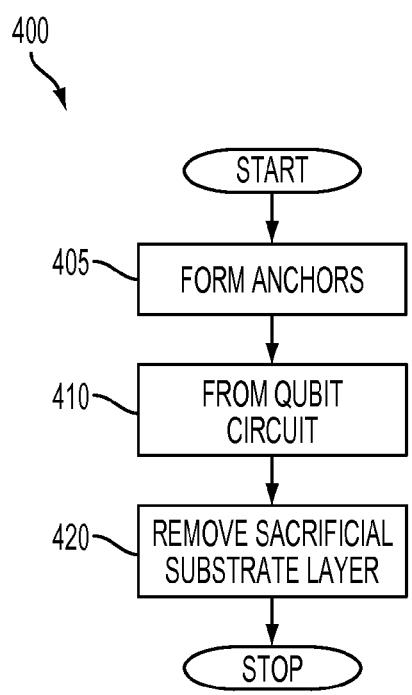
FIG. 4 illustrates a flow chart of a method of fabricating a suspended qubit circuit device in accordance with exemplary embodiments.

FIG. 4 illustrates a flow chart of a method 400 of fabricating a suspended qubit circuit device in accordance with exemplary embodiments. At block 405, anchors 305 (e.g., a metallic conductive material) are formed in the sacrificial substrate layer 315. In exemplary embodiments, holes in which the anchors 305 are disposed can be patterned with any suitable photolithography techniques, and the anchors deposited with any suitable metallic deposition techniques. As described here, the whole substrate layer (i.e., the substrate 320 and sacrificial substrate layer 315) may be chosen with at least two materials. The bulk material (e.g., the substrate 320) remains after the processing is finished, and the sacrificial material (e.g., the sacrificial substrate layer 315) is partially or fully removed during processing. The bulk material is selected to reduce dielectric loss tangent at low power.

The sacrificial material is selected to be etched selectively to the bulk substrate as well as the superconducting and dielectric material to be used for the qubit. If sacrificial material is not completely removed, then it should be chosen to reduce dielectric loss tangent at low temperatures. An example of a suitable substrate would be Silicon-on-sapphire (SOS), where the Si is the sacrificial material and the sapphire is the bulk material. As described herein, the anchor holes may be patterned using photolithography and etched into the sacrificial layer of the substrate. For a SOS substrate, examples of suitable etch methods include chlorine (Cl) or fluorine (F)-based RIE, XeF$_2$ vapor etch, or ammonia or potassium hydroxide (KOH) based chemical wet etch. After Si etch, the resist mask may be removed using any suitable technique.

Referring still to FIG. 4, at block 410, the qubit circuit is formed. As described herein, qubit fabrication may proceed by any of a number of processes that are well-known in the art. Two examples are (1) subtractive patterning of a trilayer (superconductor(s)-insulator-superconductor(s)) material stack or (2) the Dolan bridge process. Although several other qubit fabrication procedures are contemplated, the Dolan Bridge technique is described herein as an illustrative example. The main fabrication technique is now described, using a Josephson junction (a superconductor-insulator-superconductor sandwich) as an example. In exemplary embodiments, the substrate 320 can be low resistivity (Boron doped) two-inch silicon wafers. It is appreciated that the qubit is formed atop the sacrificial substrate layer 315 and the anchors 305. A bilayer of resist is spun on the wafers, which consists of a copolymer MMA layer and a subsequent thinner layer of PMMA. Using ebeam lithography, a pattern for the qubit circuit 310 is written into the resist. This step is followed by development in an MIBK:IPA (1:3) solution for about one minute, which eats away all the areas exposed to the electron beam. The MMA layer is more sensitive to the electron beam, which creates areas of undercut PMMA. As such, a suspended bridge out of the PMMA can be made with no MMA beneath. The sample is placed in an e-beam evaporator where Al is evaporated at two angles with oxidation (in an Ar/O$_2$ atmosphere) between Al evaporations. The junction is formed in the overlap area. The remaining resist and unwanted metal is removed by placing the sample in acetone. Using this lift-off technique, junction areas can be made ranging from 20 mm$^2$ to 50 nm$^2$. This basic fabrication process can be used with other extra fabrication steps such as PECVD, optical lithography, and RIE to make more complicated devices. Finally, the wafer is diced into small (~1×1 cm$^2$) chips. In exemplary embodiments, as part of the qubit circuit 310, a JBA can be fabricated. Resist is then spun over the chip. The junction with top capacitor electrodes is subsequently deposited using the procedure described above. Cr layers sandwiching a Cu layer are used to protect the Cu during silicon nitride deposition while a Ti layer is utilized to promote adhesion of a silicon nitride layer. FIG. 3b illustrates the qubit circuit 310 formed on the sacrificial substrate layer 315, and the anchors 305.

At block 420, the sacrificial substrate layer 315 is removed with any suitable etching technique. As described herein, the sacrificial substrate layer 315 is selected to be etched by techniques that do not etch the substrate 320, the anchors 305 and the qubit circuit 310. FIGS. 3C and 3D illustrate the qubit circuit 310 suspended above the substrate 320, and supported by the anchors 305.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A qubit system, comprising:
   a substrate layer;
   a qubit circuit suspended above the substrate layer, the qubit circuit comprising a trilayer Josephson junction having a suspended portion disposed between anchored larger portions at opposing ends of the suspended portion; and
   a fine structure disposed between the qubit circuit and the substrate layer;
   wherein the fine structure is a portion of the substrate that has been undercut to form an undercut structure such that the suspended portion is completely undercut from the substrate, and the anchored larger portions are only partially undercut from the substrate such that a mid-portion of a bottom surface of the anchored larger portions are in contact with the substrate, and outer portions of the bottom surface of anchored larger portions are not in contact with the substrate.

2. The system as claimed in claim 1 wherein the fine structure couples the qubit circuit to the substrate layer.

3. The system as claimed in claim 1 wherein a substrate-to-air interface is removed from electric fields of the resonant modes of the quantum circuit.

4. The system as claimed in claim 1 wherein the substrate is a on a Si-on-sapphire (SOS) substrate.

5. The system as claimed in claim 4 wherein a silicon (Si) portion of the SOS substrate is removed to form the fine structure.

\* \* \* \* \*